(12) United States Patent
Chang et al.

(10) Patent No.: US 9,231,174 B2
(45) Date of Patent: Jan. 5, 2016

(54) LED MODULE

(71) Applicant: ADVANCED OPTOELECTRONIC TECHNOLOGY, INC., Hsinchu Hsien (TW)

(72) Inventors: Chung-Min Chang, Hsinchu (TW); Chien-Lin Chang-Chien, Hsinchu (TW); Ya-Ting Wu, Hsinchu (TW); Zheng-Hua Yang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/474,767

(22) Filed: Sep. 2, 2014

(65) Prior Publication Data

US 2015/0060935 A1 Mar. 5, 2015

(30) Foreign Application Priority Data

Sep. 4, 2013 (CN) .......................... 2013 1 03960380

(51) Int. Cl.
*H01L 27/00* (2006.01)
*H01L 33/54* (2010.01)
*H01L 25/075* (2006.01)

(52) U.S. Cl.
CPC ............ *H01L 33/54* (2013.01); *H01L 25/0753* (2013.01); *H01L 2924/0002* (2013.01)

(58) Field of Classification Search
CPC .................. F21K 9/00; H01L 25/0753; H01L 2224/48091; H01L 2224/48465; H01L 2224/49107; H01L 2924/00014; H01L 2924/00; H01L 33/52; H01L 33/486; H01L 33/60
See application file for complete search history.

(56) References Cited

U.S. PATENT DOCUMENTS

| | | | |
|---|---|---|---|
| 8,956,922 B2 | 2/2015 | Peil et al. | |
| 2007/0241661 A1* | 10/2007 | Yin | 313/502 |
| 2012/0170276 A1* | 7/2012 | Li | 362/294 |

FOREIGN PATENT DOCUMENTS

| | | | |
|---|---|---|---|
| CN | 103109587 A | | 5/2013 |
| WO | WO 2012/031703 | * | 3/2012 |

\* cited by examiner

*Primary Examiner* — Victor A Mandala
*Assistant Examiner* — Quovaunda V Jefferson
(74) *Attorney, Agent, or Firm* — Novak Druce Connolly Bove + Quigg LLP

(57) ABSTRACT

An light emitting diode (LED) module includes a circuit board, a set of LED chips formed on and electrically connected to the circuit board, and an encapsulant arranged on the circuit board and covering the LED chips, a set of first recesses defined in a top surface of the encapsulant.

17 Claims, 6 Drawing Sheets

LED MODULE

CROSS-REFERENCE TO RELATED APPLICATIONS

This application claims priority to Chinese Patent Application No. 201310396038.0 filed on Sep. 4, 2013 in the State Intellectual Property Office Of The P. R. C, the contents of which are incorporated by reference herein.

FIELD

This disclosure relates to a light emitting diode (LED) module, and particularly to an integrated LED module.

BACKGROUND

Total reflection happens in the LED module, which decreases a light-extraction efficiency of the LED module.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. In addition, the description is not to be considered as limiting the scope of the embodiments described herein. The drawings are not necessarily to scale and the proportions of certain parts have been exaggerated to better illustrate details and features of the present disclosure.

Figure 1:
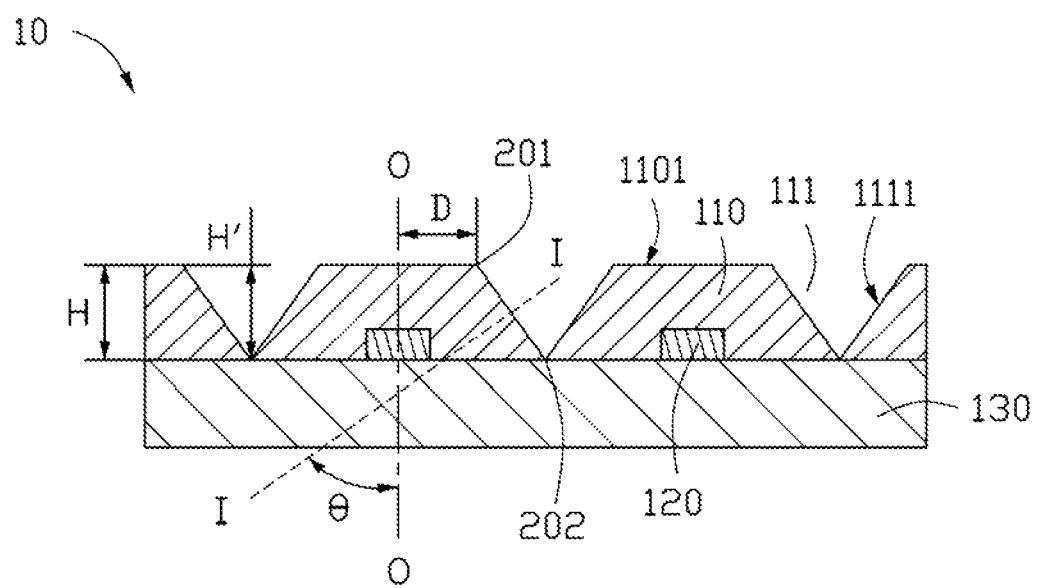
FIG. 1 is a cross-sectional diagrammatic view of an LED module in accordance with a first example embodiment of the present disclosure.

Referring to FIG. 1, a light emitting diode (LED) module 10 includes a circuit board 130, a set of LED chips 120 and an encapsulant 110. The circuit board 130 can be a circuit printed board, a ceramic base circuit board, a metal base circuit board, a fiberglass circuit board, a multilayer circuit board, a flexible circuit board, or other matter. The metal base circuit board can be an aluminum base circuit board, a copper base circuit board, or a base circuit board made of some other metal or other material. The LED chips 120 are arranged on and electrically connected to the circuit board 130. The LED chips 120 can be electrically connected to the circuit board 130 by flip-chip, wire bonding, or other means. The encapsulant 110 can be formed on the circuit board 130 and cover all or part of the LED chips 120.

A set of first recesses 111 are defined in the encapsulant 110. The first recesses 111 can be defined in a top surface 1101 of the encapsulant 110. A depth H' of each first recess 111 is less than a thickness H of the encapsulant 110.

A pair of inclined surfaces 1111 is defined in each first recess 111. A first edge 201 and a second edge 202 are defined in each inclined surface 1111. A distance between the first edge 201 and the circuit board 130 is larger than that between the second edge 202 and the circuit board 130. Each inclined surface 1111 intersects on the top surface 1101 at the first edge 201. The two inclined surfaces 1111 of each first recess 111 intersect at the second edge 202.

Figure 2:
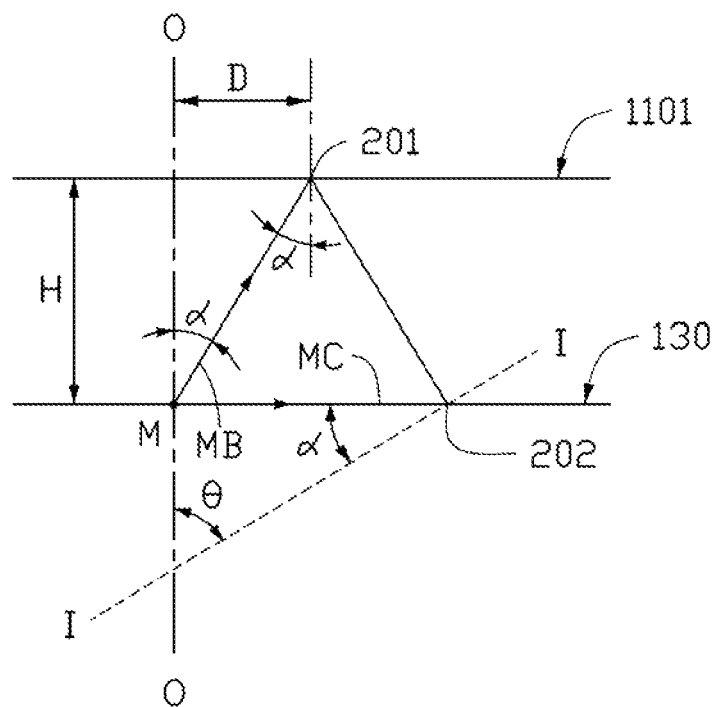
FIG. 2 is a diagrammatic view of the LED module of the present disclose.
Figure 3:
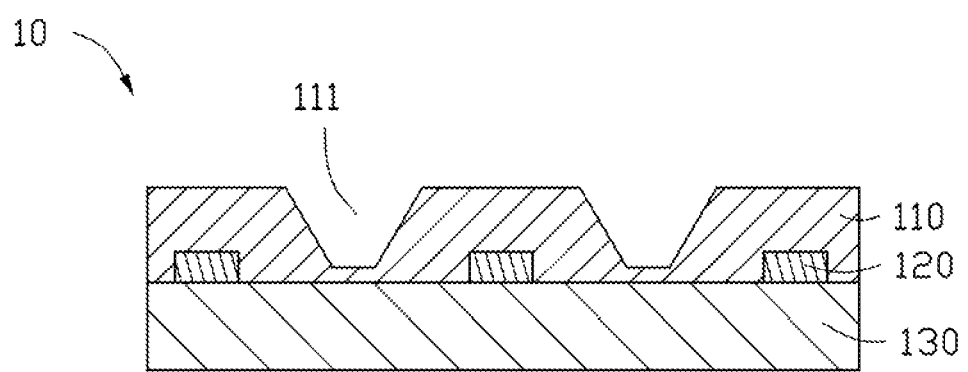
FIG. 3 is a cross-sectional diagrammatic view of an LED module in accordance with a second example embodiment of the present disclosure.

A distance D between each first edge 201 and an optic axis O-O of a neighboring LED chip 120 is larger than zero, and less than or equal to a product of the thickness H of the encapsulant 110 and a tangent of a critical angle $\alpha$ of the encapsulant 110, which is $0<D\leq H\cdot\tan\alpha$. A part of the light emitted from the LED chips 120 can reach the top surface 1101 of the encapsulant 110, and be refracted on the top surface 1101, then extract from the top surface 1101 to outside. In at least one embodiment (see FIG. 2), each LED chip 120 can be viewed as a point light source M. The top surface 1101 is parallel to the circuit board 130. An extracting angle of a light ray MB can be the critical angle $\alpha$. When the light ray MB is just refracted on the top surface 1101 and extract from the top surface 1101 to outside, the distance D of the first edge 201 and the optic axis O-O of the neighboring LED chip 120 is equal between the product of the thickness H of the encapsulant 110 and the tangent of the critical angle $\alpha$ of the encapsulant 110, which is $D=H\cdot\tan\alpha$.

An angle $\theta$ between a normal line I-I of each inclined surface 1111 and the optic axis O-O of the neighboring LED chip 120 is larger than or equal to a complement angle of the critical angle $\alpha$ of the encapsulant 110, and less than 90°, which is $90°-\alpha\leq\theta<90°$. A part of the light emitted from the LED chips can reach the inclined surface 1111 of the encapsulant 110, and be refracted on the inclined surface 1111, then extract from the inclined surface 1111 to outside. In at least one embodiment (see FIG. 2), an extracting angle of a light ray MC can be 90°. When the light ray MC is just refracted on the inclined surface 1111 and extract from the inclined surface 1111 to outside, the angle $\theta$ between the normal line I-I of each inclined surface 1111 and the optic axis O-O of the neighboring LED chip 120 is equal to the complement angle of the critical angle $\alpha$ of the encapsulant 110, which is $\theta=90°-\alpha$.

Referring to FIGS. 1 and 3-5, each first recess 111 is defined between two adjacent LED chips. In at least one embodiment, a cross section of each first recess 111 is V-shaped (see FIG. 1). In other embodiments, the cross section of each first recess 111 can be a trapezoid (see FIG. 3). A top view of the first recesses can be a cross-shaped (see FIGS. 4 and 5).

Figure 5:
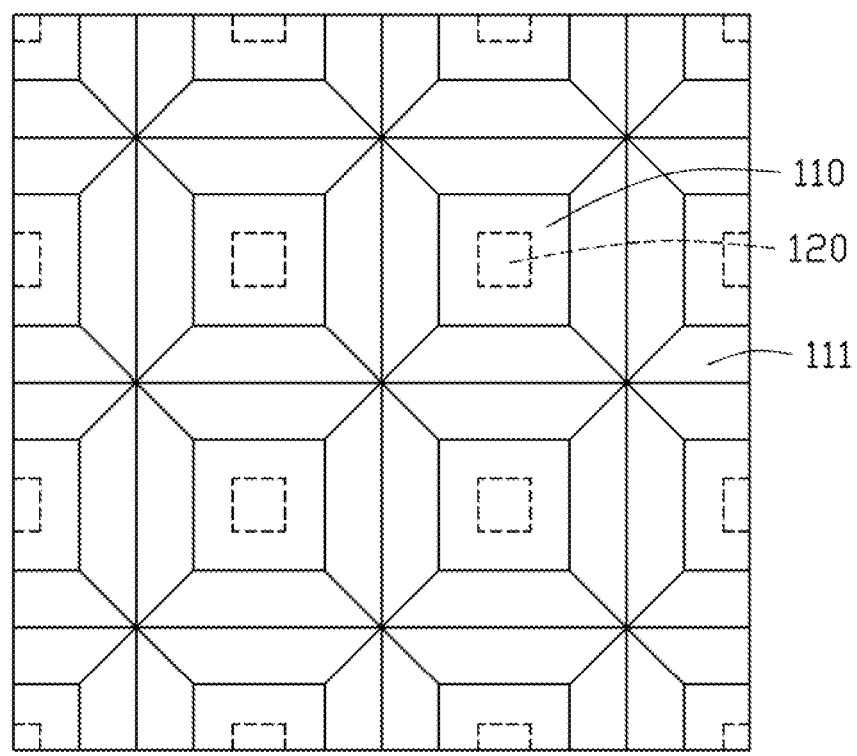
FIG. 5 is a top plan view of an LED module in accordance with a fourth example embodiment of the present disclosure.
Figure 6:
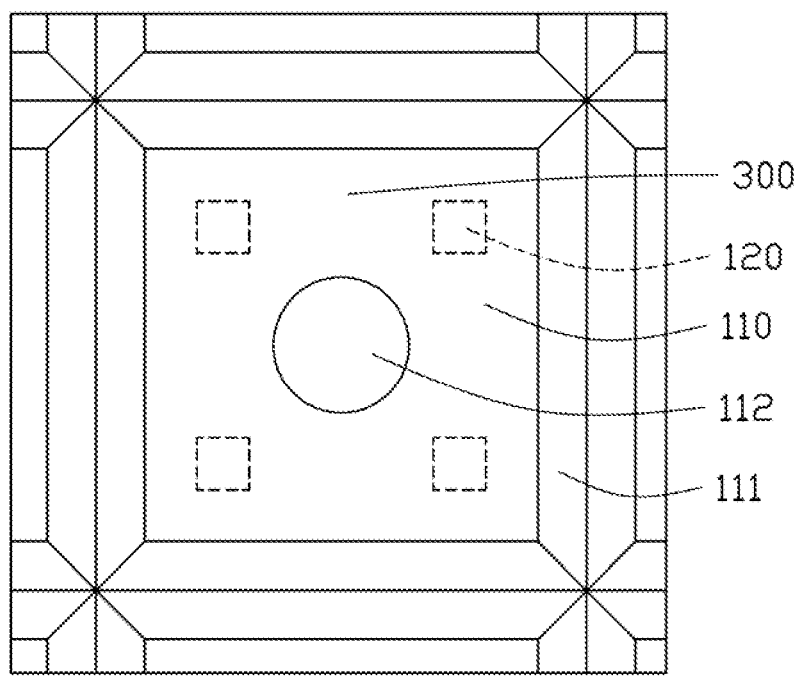
FIG. 6 is a top plan view of an LED module in accordance with a fifth example embodiment of the present disclosure.

Referring to FIGS. 5 and 6, the first recesses 111 can be defined around the LED chips 120.

Figure 4:
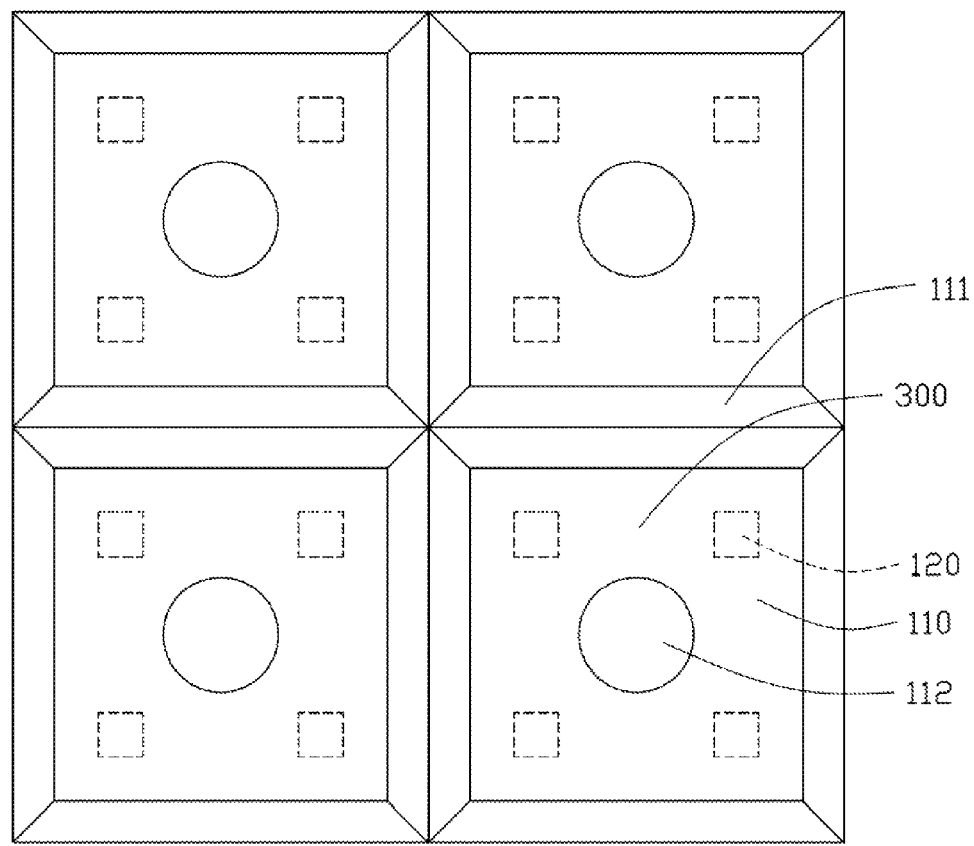
FIG. 4 is a top plan view of an LED module in accordance with a third example embodiment of the present disclosure.

Referring to FIGS. 4 and 6, a set of second recesses 112 can be defined in gaps 300 between the first recesses 111. The second recesses 112 can be defined between the LED chips 120. Each second recess 112 can be a conical recess, a truncated conical recess, or other shape or size of recess.

The encapsulant 110 can include one or more photo luminescence properties (not shown). The photoluminescence properties can be provided by phosphor powder, fluorescent powder or other material. A refractive index of the encapsulant 110 can be in a range from 1.4 to 1.5.

In at least one embodiment, the refractive index of the encapsulant 110 can be 1.4. The critical angle α of the example encapsulant 110 is 45°. The distance D between each first edge 201 and the optic axis O-O of the neighboring LED chip 120 is larger than zero, and less than or equal to H tan 45°, which is $0<D\leq H\cdot\tan 45°$. An angle θ between a normal line I-I of each inclined surface 1111 and the optic axis O-O of the neighboring LED chip 120 is larger than or equal to a complement angle of the critical angle 45° of the encapsulant 110, and less than 90°, which is $45°\leq\theta<90°$.

In at least one embodiment, the refractive index of the encapsulant 110 can be 1.5. The critical angle α of the example encapsulant 110 is 41°. The distance D between each first edge 201 and the optic axis O-O of the neighboring LED chip 120 is larger than zero, and less than or equal to H tan 41°, which is $0<D\leq H\cdot\tan 41°$. An angle θ between a normal line I-I of each inclined surface 1111 and the optic axis O-O of the neighboring LED chip 120 is larger than or equal to a complement angle of the critical angle 41° of the encapsulant 110, and less than 90°, which is $49°\leq\theta<90°$.

It is to be further understood that even though numerous characteristics and advantages have been set forth in the foregoing description of embodiments, together with details of the structures and functions of the embodiments, the disclosure is illustrative only. Changes may be made in detail, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED module. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) module comprising:
 a circuit board;
 a set of LED chips formed on and electrically connected to the circuit board;
 an encapsulant arranged on the circuit board and covering the LED chips, a set of first recesses defined in a top surface of the encapsulant; and
 a set of second recesses are defined in gaps between the first recesses.

2. The LED module of claim 1, wherein a depth of each recess is less than a thickness of the encapsulant.

3. The LED module of claim 2, wherein a pair of inclined surfaces is defined in each first recess.

4. The LED module of claim 3, wherein a first edge and a second edge are defined in each inclined surface, a distance between the first edge and the circuit board is larger than that between the second edge and the circuit board.

5. The LED module of claim 4, wherein each inclined surface intersects on the top surface at the first edge.

6. The LED module of claim 5, wherein the two inclined surfaces of each first recess intersect at the second edge.

7. The LED module of claim 6, wherein a distance between each first edge and an optic axis of a neighboring LED chip is larger than zero, and less than or equal to a product of the thickness of the encapsulant and a tangent of a critical angle of the encapsulant.

8. The LED module of claim 6, wherein an angle between a normal line of each inclined surface and the optic axis of the neighboring LED chip is larger than or equal to a complement angle of the critical angle of the encapsulant, and less than 90°.

9. The LED module of claim 2, wherein each first recess is defined between two adjacent LED chips.

10. The LED module of claim 9, wherein a cross section of each first recess is V-shaped.

11. The LED module of claim 10, wherein the first recesses are define around the LED chips.

12. The LED module of claim 11, wherein a top view of the first recesses is a cross-shaped.

13. The LED module of claim 9, wherein a cross section of each first recess is trapezoid.

14. The LED module of claim 1, wherein the second recesses are defined between the LED chips.

15. The LED module of claim 14, each second recess is a conical recess or a truncated conical recess.

16. The LED module of claim 1, wherein the encapsulant comprises a plurality of photoluminescence properties.

17. The LED module of claim 16, wherein a refractive index of the encapsulant is in a range from 1.4 to 1.5.

* * * * *